United States Patent [19]
Shah

[11] Patent Number: 5,581,226
[45] Date of Patent: Dec. 3, 1996

[54] HIGH PRESSURE SENSOR STRUCTURE AND METHOD

[75] Inventor: Mahesh Shah, Scottsdale, Ariz.

[73] Assignee: Motorola, Inc., Schaumburg, Ill.

[21] Appl. No.: 333,167

[22] Filed: Nov. 2, 1994

[51] Int. Cl.⁶ .................................................. H01L 10/10
[52] U.S. Cl. .................. 338/42; 338/36; 73/721
[58] Field of Search .................. 338/36, 42, 2, 338/4, 5; 73/724, 721, 722, 723

[56] References Cited

U.S. PATENT DOCUMENTS

| | | | |
|---|---|---|---|
| 3,325,761 | 6/1967 | McLellan | 338/4 |
| 3,341,794 | 9/1967 | Stedman | 338/4 |
| 4,670,730 | 6/1987 | Takeda et al. | 338/4 |
| 4,712,082 | 12/1987 | Ito et al. | 338/4 |
| 4,840,067 | 6/1989 | Nishida et al. | 73/726 |
| 4,939,497 | 7/1990 | Nishida et al. | 338/4 |
| 5,001,934 | 3/1991 | Tuckey | 338/4 X |
| 5,343,757 | 9/1994 | Tate | 73/724 |
| 5,461,922 | 10/1995 | Koen | 73/723 |
| 5,488,869 | 2/1996 | Renaud | 73/724 |

*Primary Examiner*—Teresa J. Walberg
*Assistant Examiner*—Karl Easthom
*Attorney, Agent, or Firm*—Kevin B. Jackson

[57] ABSTRACT

A high pressure sensor structure (11, 111, 211) includes a housing (12, 112, 212) having an upper cavity portion (13, 113, 213) and a lower cavity portion (16, 116, 216). A diaphragm (18, 118, 218) separates the upper cavity portion (13, 113, 213) from the lower cavity portion (16, 116, 216). A semiconductor chip (26, 126, 226) is attached to the upper surface of the diaphragm (18, 118, 218) within the upper cavity portion (13, 113, 213). The diaphragm (18, 118, 218) has a thickness (21, 121, 221) and an exposed width (23, 123, 223) such that the semiconductor chip (26, 126, 226) generates a measurable output signal when the lower surface of the diaphragm (18, 118, 218) is exposed to a high pressure environment.

19 Claims, 1 Drawing Sheet

HIGH PRESSURE SENSOR STRUCTURE AND METHOD

BACKGROUND OF THE INVENTION

This invention relates, in general, to solid state pressure sensors, and more particularly, to structures for sensing high pressures.

Solid state pressure sensing devices are well known and are used in many applications today based on the piezo-resistive characteristics of silicon. High pressure sensing devices, that is, devices capable of sensing pressures up to approximately 14,000 kiloPascal (kPa) (approximately 2000 pounds/square inch (psi)), typically comprise a silicon die that has an etched cavity to form a diaphragm. The silicon die is housed in a package that includes a metal barrier that separates the silicon die from a high pressure environment. The metal barrier is spaced a distance away from the silicon die to form a chamber. The chamber is filled with a silicone oil, which together with the metal barrier acts as a transfer media.

When the high pressure sensing device is exposed to a high pressure environment, the metal barrier is displaced toward the silicon die causing a displacement in the silicone oil and ultimately a displacement in the diaphragm. When the diaphragm is displaced, an electrical output signal is generated having a magnitude that is a function of the amount of stress in the piezo-resistive material.

Existing high pressure sensing devices have several disadvantages. First, they use a cavity etched silicon die, which is susceptible to stress related failures because of the fragile nature of the etched diaphragm. Also, expensive processing steps are necessary to form the cavity in the silicon die. In addition, existing high pressure sensing devices have a limited temperature operating range because of the thermal expansion characteristics of the silicone oil. At elevated temperatures, the silicone oil expands and applies a pressure against the metal barrier and the external pressure applied to the metal barrier, which causes the silicon die to sense an inaccurate external pressure. Additionally, the silicone oil is incompatible with many die attach materials, which results in reliability problems. Furthermore, existing high pressure sensing devices require manufacturers to control the tolerances of the metal barrier, the silicone oil, and the silicon die in order to fabricate reliable devices on a large scale production basis with minimal device-to-device variability. This greatly increases manufacturing costs.

Consequently, a need exists for a high pressure sensing device that is capable of accurately measuring pressures up to 14,000 kPa range, that does not utilize a cavity etched semiconductor die, that eliminates the need for a metal barrier/silicone oil transfer media, and that is cost effective.

DETAILED DESCRIPTION OF THE DRAWINGS

Figure 1:
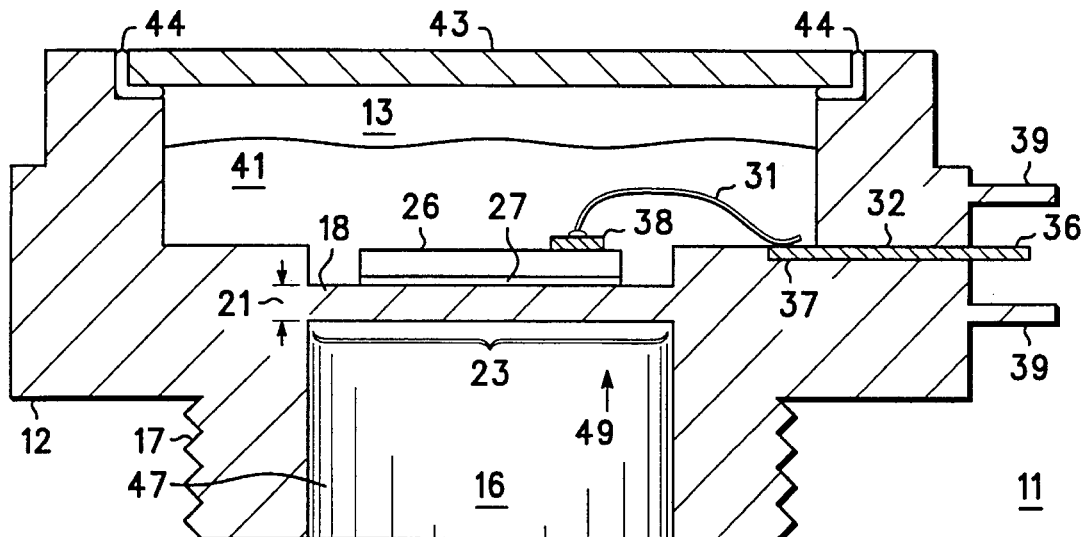
FIG. 1 illustrates a cross-sectional view of an embodiment of a high pressure sensor structure according to the present invention.
Figure 2:
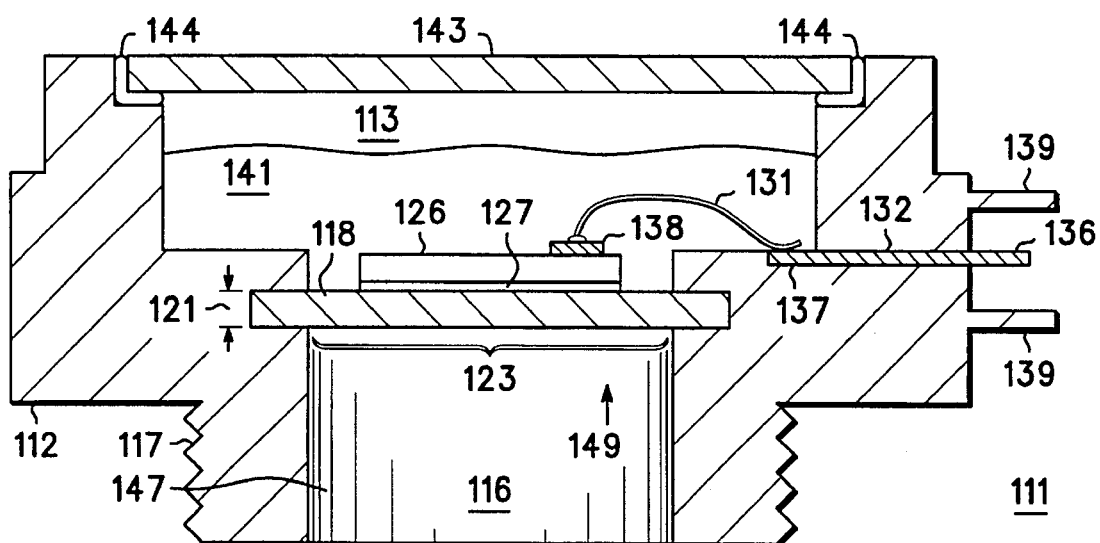
FIG. 2 illustrates a cross-sectional view of another embodiment of a high pressure sensor structure according to the present invention.
Figure 3:
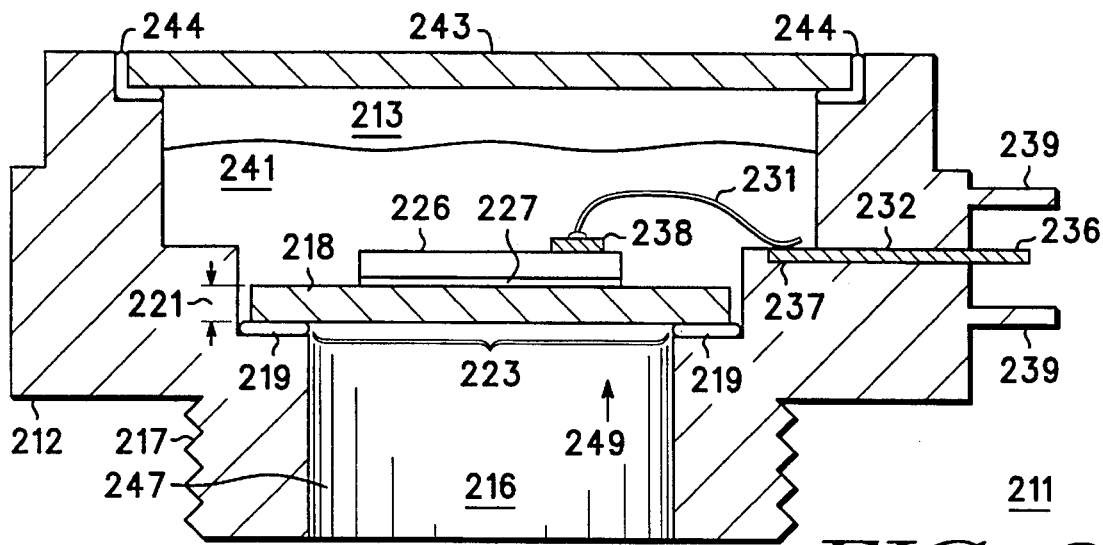
FIG. 3 illustrates a cross-sectional view of a further embodiment of a high pressure sensor structure according to the present invention.

A high pressure sensor structure according to the present invention can be better understood with reference to FIGS. 1–3. FIG. 1 illustrates a cross-sectional view of a high pressure sensor structure or device 11 for sensing high pressures up to approximately 14,000 kPa (approximately 2000 psi). Sensor structure 11 comprises a housing or hollow containing structure 12. Preferably, housing 12 comprises an injection molded plastic and is formed using well known process techniques. High strength engineering plastics preferably are used such as glass-filled plastics, liquid crystal polymer (LCP), or glass-filled polyphenylene sulfide (PPS).

Housing 12 includes an upper cavity or portion 13 and a lower cavity or portion 16. A pressure introducing portion or diaphragm 18 is within housing 12 and separates upper cavity 13 from lower cavity 16. Preferably, lower cavity portion 16 has a round or cylindrical geometry. Outer surface 17 of lower cavity 16 is shown in a threaded configuration, such as a ¾" National Pipe Thread (NPT) for example. Outer surface 17 is modified depending on the specific application requirements.

Preferably, and as shown in FIG. 1, diaphragm 18 comprises a plastic and is integrally formed with housing 12 during the injection molding process. Diaphragm 18 has a thickness 21, which preferably is substantially uniform across exposed width or free span 23 of diaphragm 18 on the exposed portion of the lower surface of diaphragm 18.

Sensor structure 11 further comprises semiconductor chip or sensing chip 26 attached to an upper surface of diaphragm 18 within upper cavity 13. Preferably, semiconductor chip 26 is attached to the upper surface with bonding layer 27. Bonding layer 27 preferably comprises a die bonding adhesive such as a thermoplastic, an epoxy, or a polyimide. Bonding layer 27 preferably has a thickness on the order of approximately 0.1 mm (approximately 4 mils). Semiconductor chip 26 is preferably substantially centrally attached to the upper surface.

Semiconductor chip 26 preferably comprises a silicon transducer that is uncompensated (provides sensing output only), compensated (provides sensing output and temperature and/or offset compensation) or integrated (provides signal processing). Semiconductor chip 26 is formed using conventional processing techniques well known in the art. Preferably, semiconductor chip 26 does not include a cavity etched diaphragm and has a die thickness in a range from approximately 0.3 to 0.5 mm (approximately 12 to 18 mils). Bonding pads 38 are formed on semiconductor chip 26. As will be explained in more detail below, thickness 21 of diaphragm 18 and exposed width 23 are chosen so that semiconductor chip 26 generates a measurable electrical signal within a specific high pressure range without overly stressing, cracking, or causing failure to semiconductor chip 26, housing 12, and/or diaphragm 18.

Sensor structure 11 further includes a conductive connective structure for electrically coupling semiconductor chip 26 to an external measuring system. The conductive connective structure preferably includes wire bonds or conductive wires 31 and conductive leads 32. Preferably, at least a portion of conductive leads 32 is integral with housing 12. Only one wire bond and one conductive lead is shown. Each of conductive leads 32 has an external connecting end 36 and a bond post end 37. Each of wire bonds 31 is coupled at one end to one of bonding pads 38 on semiconductor chip 26 and coupled at an opposite end to a bond post end 37. Housing 12 is shown with an optional connector 39 that is preferably integrally formed with housing 12. Connector 39 is designed to accommodate standard mating electrical cable connectors.

A protective layer 41 preferably covers at least semiconductor chip 26 and wire bonds 31. Preferably, protective layer 41 comprises an organic or inorganic die passivation material. Examples include silicone gel, Parylene, available from Union Carbide Co. of Danbury, Conn., silicon-nitride, or silicon-carbide. Enclosure or lid 43 covers upper cavity 13 and is attached to housing 12 using an adhesive layer 44. Adhesive layer 44 preferably comprises a one part or two part epoxy. Enclosure 43 comprises a plastic, metal, ceramic, or composite material. Preferably, enclosure 43 comprises a material capable of receiving and retaining a product identification marking. Preferably, enclosure 43 comprises a metal or a plastic when laser marking methods are used.

When sensor structure 11 is placed in a high pressure environment or media, such as in an automotive brake line system, lower cavity 16 is placed such that opening 47 in lower cavity 16 is exposed to the high pressure environment. The high pressure media contacts the lower surface of diaphragm 18 which displaces diaphragm 18 in the direction of arrow 49. This displacement places semiconductor chip 26 under stress. This stress causes semiconductor chip 26 to produce an output signal that is a function of the applied pressure. The output signal is sent to an external measuring or monitoring system such as an electronic engine control module designed to process the output signal.

In a preferred embodiment of sensor structure 11 for measuring pressures in a range of 0 to 3,400 kPa (0–500 psi) without overly stressing sensor structure 11, thickness 21 of diaphragm 18 is approximately 1.0 mm (approximately 40 mils) and exposed width 23 is approximately 7.5 mm (approximately 300 mils). For sensor structure 11 to detect pressures in a range from 0 to 6,800 kPa (0 to 1000 psi), thickness 21 is approximately 1.5 mm (approximately 60 mils) and exposed width 23 is approximately 7.5 mm (approximately 300 mils). For sensor structure 11 to detect pressures in a range from 0 to 14,000 kPa (0 to 2000 psi), thickness 21 is approximately 1.5 mm (approximately 60 mils) and exposed width 23 is approximately 6.0 mm (approximately 240 mils).

Because sensor structure 11 utilizes diaphragm 18, which is external to semiconductor chip 26, semiconductor chip 26 does not require a cavity etched diaphragm. This improves the reliability of sensor structure 11 because die related stress failures at high pressure are reduced. In addition, semiconductor chip manufacturing costs are reduced because expensive processing steps are eliminated. Sensor structure 11 eliminates the need for a metal barrier/silicone oil transfer media, which saves on cost, improves sensitivity over a wider temperature range, and greatly reduces device-to-device variability.

FIG. 2 illustrates another embodiment of a high pressure sensor structure 111. Sensor structure 111, like sensor structure 11, comprises housing 112, which has an upper cavity portion or upper portion 113, and a lower cavity portion or lower portion 116. Preferably, housing 112 comprises plastic and is preferably formed using well known injection molding techniques. Outer surface 117 of lower cavity portion 116 is shown in a threaded configuration. This configuration is modified depending on the specific application requirements.

A diaphragm 118 separates upper cavity portion 113 from lower cavity portion 116. In this embodiment, diaphragm 118 comprises a metal insert, which preferably is embedded in housing 112 during the injection molding process. Diaphragm 118 is integral with conductive leads 132 in a lead frame configuration. Optionally, diaphragm 118 is attached to a lead frame that includes conductive leads 132. Optionally, diaphragm 118 is a separate piece part. Preferably, diaphragm 118 comprises an iron/nickel alloy such as Alloy 42, available from Carpenter Technology Co. of Reading, Pa., or Kovar®. Diaphragm 118 has a thickness 121, which is substantially uniform across exposed width or free span 123 of diaphragm 118 on the lower cavity portion 116 side of diaphragm 118.

Sensor structure 111 further comprises semiconductor chip or transducer 126 attached to an upper surface of diaphragm 118. Preferably, semiconductor chip 126 is bonded to diaphragm 118 with an organic bonding layer, an inorganic glass layer, a glass frit layer, a solder layer, or the like. Semiconductor chip 126 is similar to semiconductor chip 26. Thickness 121 of diaphragm 118 and exposed width 123 are selected so that semiconductor chip 126 produces a detectable output signal within a desired pressure range without placing excessive stress on semiconductor chip 126, housing 111, and/or diaphragm 118. Element numbers 131–149 in FIG. 2 correspond to elements numbers 31–49 in FIG. 1 and are not described to avoid redundancy.

In a preferred embodiment of sensor structure 111 for measuring pressures in a range of 0 to 3,400 kPa (0–500 psi) without overly stressing sensor structure 111, thickness 121 of diaphragm 118 is preferably approximately 0.5 mm (approximately 20 mils) and exposed width 123 is preferably approximately 7.5 mm (approximately 300 mils). For sensor structure 111 to detect pressures in a range from 0 to 6,800 kPa (0 to 1000 psi), thickness 121 is approximately 0.8 mm (approximately 30 mils) and exposed width 123 is approximately 6.0 mm (approximately 240 mils). For sensor structure 111 to detect pressures in a range from 0 to 14,000 kPa (0 to 2000 psi), thickness 121 is approximately 1.0 mm (approximately 40 mils) and exposed width 123 is approximately 6.0 mm (approximately 240 mils).

FIG. 3 illustrates a further embodiment of a cross-sectional view of a high pressure sensor structure 211 according to the present invention. Sensor structure 211 comprises a housing 212 having an upper cavity portion 213 and a lower cavity portion 216. In this embodiment, housing 212 comprises a ceramic material and is formed using well known processes such as pressing, firing, and machining (if required) processes. Outer surface 217 of lower cavity portion 216 is shown in a threaded configuration. This configuration is modified depending on the specific application requirements.

A diaphragm 218 separates upper cavity portion 213 from lower cavity portion 216. In this embodiment, diaphragm 218 preferably comprises an iron/nickel alloy such as Alloy 42 or Kovar® and is bonded to housing 212 between upper cavity portion 213 and lower cavity portion 216 using a bonding layer 219. Bonding layer 219 preferably comprises a sealing glass, glass-frit, silver-glass, or an organic material. In the embodiment shown, bonding layer 219 is on the same side as lower cavity portion 216. In an optional embodiment, bonding layer 219 is on the same side as upper cavity portion 213. In this optional embodiment, compressive stress is applied to bonding layer 219 when lower cavity portion 216 is exposed to a high pressure environment. Diaphragm 218 has a thickness 221, which is substantially uniform across exposed width or free span 223 of diaphragm 218 on the lower cavity portion 216 side of diaphragm 218.

Semiconductor chip or transducer 226 is attached to an upper surface of diaphragm 218 preferably using a bonding layer 227. Semiconductor chip 226 is similar to semiconductor chip 26 and 126. Bonding layer 227 is similar to bonding layer 127. Thickness 221 of diaphragm 218 and exposed width 223 are selected such that semiconductor chip 226 produces a monitorable output response within a specific pressure range without excessively stressing semiconductor chip 226, housing 211, and/or diaphragm 218. Preferably, thickness 221 and exposed width 223 are the same as those set out above for sensor structure 111. Element numbers 231–249 in FIG. 3 correspond to element numbers 31–49 in FIG. 1 and are not described to avoid redundancy. Although more expensive than sensor structure 111, sensor structure 211 is preferred for applications requiring pressure sensing of certain hazardous media or pressure sensing at high operating temperatures.

By now it should be appreciated that there has been provided a high pressure sensor structure for sensing pressures up to approximately 14,000 kPa (approximately 2000 psi). The high pressure structure includes a housing having an upper and lower cavity and a pressure introducing portion within the housing. The pressure introducing portion separates the upper cavity and the lower cavity. A solid state transducer is attached to the upper surface of the pressure introducing portion within the upper cavity. The thickness and exposed width of the pressure introducing portion are chosen such that the transducer generates a measurable output signal within a specific pressure range. Because the pressure introducing portion is external to the solid state transducer, the need for a cavity etched transducer is eliminated. This saves on manufacturing costs. In addition, the high pressure sensor structure eliminates the need for a metal barrier/silicone oil transfer media. This provides a high pressure sensor that is less sensitive to temperature, that is more cost effective, and that has a reduced device-to-device variability.

I claim:

1. A high pressure sensor structure comprising:
   a housing having an upper cavity, and a lower cavity;
   a pressure introducing portion separating the upper cavity from the lower cavity, the pressure introducing portion having a thickness, an exposed width, an upper surface, and a lower surface, wherein the lower cavity has an opening, and wherein the thickness is substantially uniform across the exposed width;
   a sensing chip attached to the upper surface of the pressure introducing portion within the upper cavity;
   a conductive connective structure coupled to the sensing chip; and
   an enclosure covering the upper cavity.

2. The structure of claim 1 wherein the housing comprises an injection molded plastic.

3. The structure of claim 2 wherein the pressure introducing portion comprises plastic, and wherein the pressure introducing portion is integral with the housing.

4. The structure of claim 3 wherein the exposed width is in a range from approximately 6.0 to 7.5 mm, and wherein the thickness is in a range from approximately 1.0 to 1.5 mm, such that the high pressure sensor structure measures pressures up to approximately 14,000 kPa.

5. The structure of claim 2 wherein the pressure introducing portion comprises a metal insert.

6. The structure of claim 5 wherein the exposed width is in a range from approximately 6.0 to 7.5 mm, and wherein the thickness is in a range from approximately 0.5 to 1.0 mm, such that the high pressure sensor structure measures pressures up to approximately 14,000 kPa.

7. The structure of claim 1 wherein the housing comprises a ceramic.

8. The structure of claim 7 wherein the pressure introducing portion comprises a metal, and wherein the pressure introducing portion is bonded to the housing.

9. The structure of claim 8 wherein the exposed width is in a range from approximately 6.0 to 7.5 mm, and wherein the thickness is in a range from approximately 0.5 to 1.0 mm, such that the high pressure sensor structure measures pressures up to approximately 14,000 kPa.

10. The structure of claim 1 wherein the sensing chip includes a plurality of bonding pads, and wherein the conductive connective structure includes a plurality of wire bonds and a plurality of conductive leads, the plurality of wire bonds electrically connecting the plurality of bonding pads to the plurality of conductive leads.

11. The structure of claim 10 wherein at least a portion of the plurality of conductive leads is integral with the housing.

12. The structure of claim 10 further comprising a protective layer covering at least the sensing chip and the plurality of wire bonds.

13. A device for sensing high pressures having a diaphragm external to a semiconductor chip comprising:
    a hollow containing structure having an upper portion and a lower portion, the lower portion open at one end and having an outer surface;
    a diaphragm within the hollow containing structure separating the upper portion from the lower portion, the diaphragm having a thickness, an upper surface, a lower surface, and an exposed width, the thickness substantially uniform across the exposed width, wherein the hollow containing structure and the diaphragm comprise an injection molded plastic, and wherein the diaphragm is integral with the hollow containing structure;
    a semiconductor chip attached to the upper surface of the diaphragm within the upper portion, the semiconductor chip having a plurality of bonding pads;
    a plurality of conductive leads, each having a bond post end and an external connecting end;
    a plurality of conductive wires electrically connecting the plurality of bonding pads to the plurality of conductive leads; and
    a lid covering the upper portion.

14. The device of claim 13 further comprising a protective layer covering at least the semiconductor chip and the plurality of conductive wires.

15. The device of claim 13 wherein the thickness is in a range from approximately 6.0 to 7.5 mm, and wherein the exposed width is in a range from approximately 1.0 to 1.5 mm.

16. The device of claim 13 wherein the outer surface of the lower portion is threaded.

17. A method for making a high pressure sensor structure comprising the steps of:
    providing a housing having an upper cavity, a lower cavity, a pressure introducing portion separating the upper cavity from the lower cavity, and a conductive connective structure, the pressure introducing portion having a thickness, an exposed width, an upper surface, and a lower surface, the lower cavity having an opening for exposing the lower surface to a high pressure media, and wherein the thickness is substantially uniform across the exposed width;
    attaching a semiconductor transducer to the upper surface of the pressure introducing portion within the upper cavity;

connecting the semiconductor transducer to the conductive connective structure; and enclosing the upper cavity.

18. The method of claim 17 wherein the step of providing the housing includes providing an injection molded plastic housing, and wherein the pressure introducing portion comprises an injection molded plastic, and wherein the pressure introducing portion is integral with the housing.

19. The method of claim 18 wherein the step of providing the injection molded plastic housing includes providing the injection molded plastic housing wherein the thickness of the pressure introducing portion is in a range from 6.0 to 7.5 mm, and wherein the exposed width of the pressure introducing portion is in a range from 1.0 to 1.5 mm.

* * * * *